United States Patent [19]

Pantusco et al.

[11] 3,953,281
[45] Apr. 27, 1976

[54] METHOD AND SYSTEM FOR GROWING MONOCRYSTALLINE INGOTS

[75] Inventors: Anthony A. Pantusco, Newburgh, N.Y.; Warren J. Pinckney, New Fairfield, Conn.; George R. Santillo, Jr., Wappinger Falls; Gerard J. Scharff, Fishkill, both of N.Y.

[73] Assignee: International Business Machines Corporation, Armonk, N.Y.

[22] Filed: June 27, 1974

[21] Appl. No.: 483,511

[52] U.S. Cl. .............................. 156/618; 23/273 SP
[51] Int. Cl.² ......................................... B01J 17/18
[58] Field of Search ............... 23/301 SP, 301 SPC, 23/273 SP, 273 SPC; 254/175.3, 148; 156/617, 618

[56] References Cited
UNITED STATES PATENTS

| | | | |
|---|---|---|---|
| 396,430 | 1/1889 | Reichel | 254/175.3 |
| 719,466 | 2/1903 | Hiss | 254/175.3 |
| 3,173,765 | 3/1965 | Gobat et al. | 23/301 SP |
| 3,275,417 | 9/1966 | Hunt | 23/301 SP |
| 3,650,701 | 3/1972 | Forrat | 23/273 SP |
| 3,679,370 | 7/1972 | Czeck et al. | 23/273 SP |

*Primary Examiner*—Norman Yudkoff
*Assistant Examiner*—Curtis P. Ribando
*Attorney, Agent, or Firm*—Frank C. Leach, Jr.; William J. Dick

[57] ABSTRACT

A monocrystalline silicon ingot is grown from molten silicon by progressively lifting a monocrystalline seed from the molten silicon, which is disposed within a crucible in a furnace, through mounting the seed on a graphite pull shaft. The pull shaft is surrounded by a bellows, which is connected to a carriage to which the pull shaft also is connected. A seal, which is carried by the bellows structure, seals the pull shaft in its rotary motion. Because the bellows structure and the pull shaft are both connected to the carriage, there is no relative linear motion therebetween so that there is no necessity to seal for linear motion of the pull shaft. A pair of lifting mechanisms is connected to diametrically opposite sides of the carriage to support the carriage and to exert a lifting force on the pull shaft along its longitudinal axis. The crucible also must be raised as the level of the molten silicon is depleted due to the formation of the ingot on the seed at the end of the pull shaft. This is because there is an optimum heating zone, which is an isothermal zone and is relatively small, within the furnace, and it is necessary for the level of the molten silicon to be maintained within this zone. The crucible is lifted through being connected to a carriage, which is supported and lifted by a similar arrangement to that for lifting the carriage to which the pull shaft is connected.

18 Claims, 6 Drawing Figures

METHOD AND SYSTEM FOR GROWING MONOCRYSTALLINE INGOTS

In the formation of monocrystalline silicon by the crystal pulling technique known as the Czochralski technique, a monocrystalline seed is dipped into a molten mass of silicon, and the surface of solidification of the crystal is gradually advanced from the seed to the molten substance to form a monocrystalline ingot.

One previously suggested system for forming monocrystalline silicon according to the Czochralski technique is disclosed in U.S. Pat. No. 3,173,765 to Gobat et al. In the aforesaid Gobat et al. patent, the pull shaft is stationary while the molten silicon is hydraulically lowered to effect the growth of the ingot. This arrangement has the disadvantage of not being able to maintain the level of molten silicon within an isothermal heating zone and such is not even recognized in the aforesaid Gobat et al patent.

It has been found that one does not get good crystal growth if the level of molten silicon is not disposed in the isothermal heating zone. If the level of molten silicon is not located in the isothermal heating zone, which is relatively small, it is difficult to control the diameter of the ingot and excess silicon dioxide forms on the crucible, for example. Thus, the desired crystal growth is not obtained.

Furthermore, the structure of the aforesaid Gobat et al patent does not provide for rotation of the molten silicon. By rotating the molten silicon, a more uniform temperature is obtained. This also stirs any dopant, which is added to the silicon, to provide more uniform distribution thereof within the silicon.

Another previously suggested system has been capable of both lifting the pull shaft as the ingot is formed and lifting the molten silicon within the furnace as the molten silicon level falls so as to maintain the silicon level within the isothermal heating zone. The previously suggested system also has rotated both the pull shaft and the molten silicon to obtain mixing of any dopant and desired crystal growth.

However, this system has utilized lead screws and cantilevered lift mechanisms to accomplish the lifting. As a result of the use of the cantilevered lead screw lift mechanisms, long term maintenance of critical alignment parameters has been extremely difficult, especially with the increasing load requirements of large ingot growth. Thus, as the length of the ingot increases, the previously suggested system has produced an eccentric load of increasing magnitude. This has resulted in the ingots not always being satisfactory.

The use of the cantilevered lead screw drive mechanisms produces sag of the carriage for lifting the pull shaft and sag of the carriage for lifting the molten silicon because of the bearings and other structure of each of the carriages being subjected to the cantilevered loads. This sagging of the carriages prevents the required precise locations of the end of the pull shaft and the level of the molten silicon. Additionally, as the weight of the ingot increases, chatter of the carriages occurs to again present the problem of precise locations of the end of the ingot and the level of the molten silicon.

The present invention satisfactorily overcomes the foregoing problems by both lifting the seed on which the ingot is being formed and maintaining the level of molten silicon within the isothermal heating zone without any eccentric loads, carriage sag, or carriage chatter. Thus, the present invention is readily adaptable to forming single crystal ingots of silicon of relatively long length.

In the previously suggested system having lifting of both the pull shaft and the molten silicon, the pull shaft has both linear and rotary motion relative to a seal at the top of the furnace. As a result of the linear motion of the pull shaft relative to the seal, a precise alignment is required between the pull shaft and the seal to achieve efficient sealing and smooth operation throughout the entire length of the pull shaft motion. If the pull shaft is not precisely aligned along its entire length, compression on one side of the seal would occur to damage it.

The present invention satisfactorily solves the foregoing problem through utilizing an expansible bellows to eliminate the need for any linear motion of the pull shaft relative to the seal as the pull shaft lifts the ingot upwardly. By supporting the seal on an upper portion of the bellows structure so that there is no relative motion between the seal and the pull shaft as the pull shaft is lifted since the upper portion of the bellows structure and the pull shaft move linearly together, the problem of sealing for linear motion of the pull shaft is eliminated.

As a result of elimination of linear motion between the pull shaft and the seal, the requirement of precise alignment of the length of the pull shaft relative to the seal is eliminated. It is only necessary to have precise alignment between the seal and the portion of the pull shaft, which the seal is surrounding, for the seal to effectively seal against rotary motion of the pull shaft.

By eliminating the longitudinal alignment requirement between the pull shaft and the seal, it is not necessary that the entire length of the pull shaft be formed of a material capable of formation to very precise tolerances such as stainless steel, for example. It is only the portion of the pull shaft within the seal that must have very precise tolerances. Accordingly, this elimination of the precise alignment of the entire length of the pull shaft to the seal allows most of the length of the pull shaft to be formed of a material which will not warp, for example, at the very high temperatures such as 2700° F., for example, to which the pull shaft is subjected during growth of the ingot.

The present invention uses a graphite pull shaft to support the monocrystalline seed since this is not subjected to warpage at the very high temperatures. The upper end of the graphite pull shaft is connected to a pull shaft stud, which has the desired alignment with the seal since there is rotary motion of the pull shaft and the pull shaft stud relative to the seal.

As a result of using the graphite pull shaft and connecting it to the pull shaft stud of stainless steel with the stud rotating within the seal, the problems associated with a steel pull shaft are eliminated. Thus, there is no orbiting of the seed and the ingot growing therefrom. This enables more precise control of the diameter of the crystal ingot to be obtained.

The elimination of the linear motion between the seal and the pull shaft also eliminates the possibility of damage to the seal due to exposure of the very hot pull shaft when it is necessary to quickly withdraw the ingot from the molten silicon to enable rapid burn off of silicon dioxide building up in the crucible containing the molten silicon, for example. Since there is no motion of the pull shaft relative to the seal, the present invention eliminates any possible damage to the seal due to the rapid motion of the pull shaft, which would be very hot, because of the quick withdrawal of the ingot from the molten silicon.

The high conductivity of the graphite pull shaft results in quicker growth of the ingot than when using a steel pull shaft, for example. This is because the high thermal conductivity of graphite causes more heat to be drawn from the silicon seed than stainless steel can draw in the same period of time so that the ingot can cool quicker. Since solidifying of the ingot causes its growth, the reduction of heat in the ingot through rapid heat transfer to the graphite pull shaft accelerates the growth of the ingot.

In the previously suggested system in which there is lifting of both the pull shaft and the molten silicon, the height of the overall structure has determined the length of the grown ingot. That is, because the pull shaft must be capable of moving the length to which the ingot is grown, any increase in the desired length of the ingot has not only increased the height of the furnace to accommodate the increased ingot length but has also produced the same additional increase in the overall structure to accommodate the extra distance that the pull shaft must move for the additional length of the ingot. Thus, if an ingot having a length of 36 inches is desired, for example, then the furnace must be sufficiently high to enable the 36 inch ingot to remain therein, and the lifting structure for the pull shaft must be able to move this distance above the furnace. As a result, a room with a relatively high ceiling must be employed if it is desired to grow ingots of a relatively long length such as 36 inches, for example.

The present invention satisfactorily solves this problem since it is not necessary to have the initial height of the furnace equal to the entire length to which the ingot is to be grown. Instead, the bellows of the present invention forms an extension of the furnace as the ingot grows. Since the lifting mechanism is directly connected to the bellows, no further additional space, which is equivalent to the ingot growth, need be supplied for the lifting arrangement. Accordingly, the system of the present invention permits the manufacture of relatively long ingots such as 36 inches, for example, within an area having a normal commercial building ceiling height such as 10 feet, for example.

An object of this invention is to provide a method and system for linearly moving and rotating a monocrystalline ingot, which is being grown on a monocrystalline seed from a molten material, without an eccentric load.

Another object of this invention is to provide a method and system for producing relatively long ingots with a relatively short overall structure.

A further object of this invention is to provide a method and system for insuring that the end of an ingot and the level of the molten material from which the ingot is being grown are in an optimum heat location in the furnace.

Still another object of this invention is to provide a method and system for producing quicker growth of a monocrystalline ingot.

The foregoing and other objects, features, and advantages of the invention will be apparent from the following more particular description of the preferred embodiment of the invention as illustrated in the accompanying drawings.

Figure 1A:
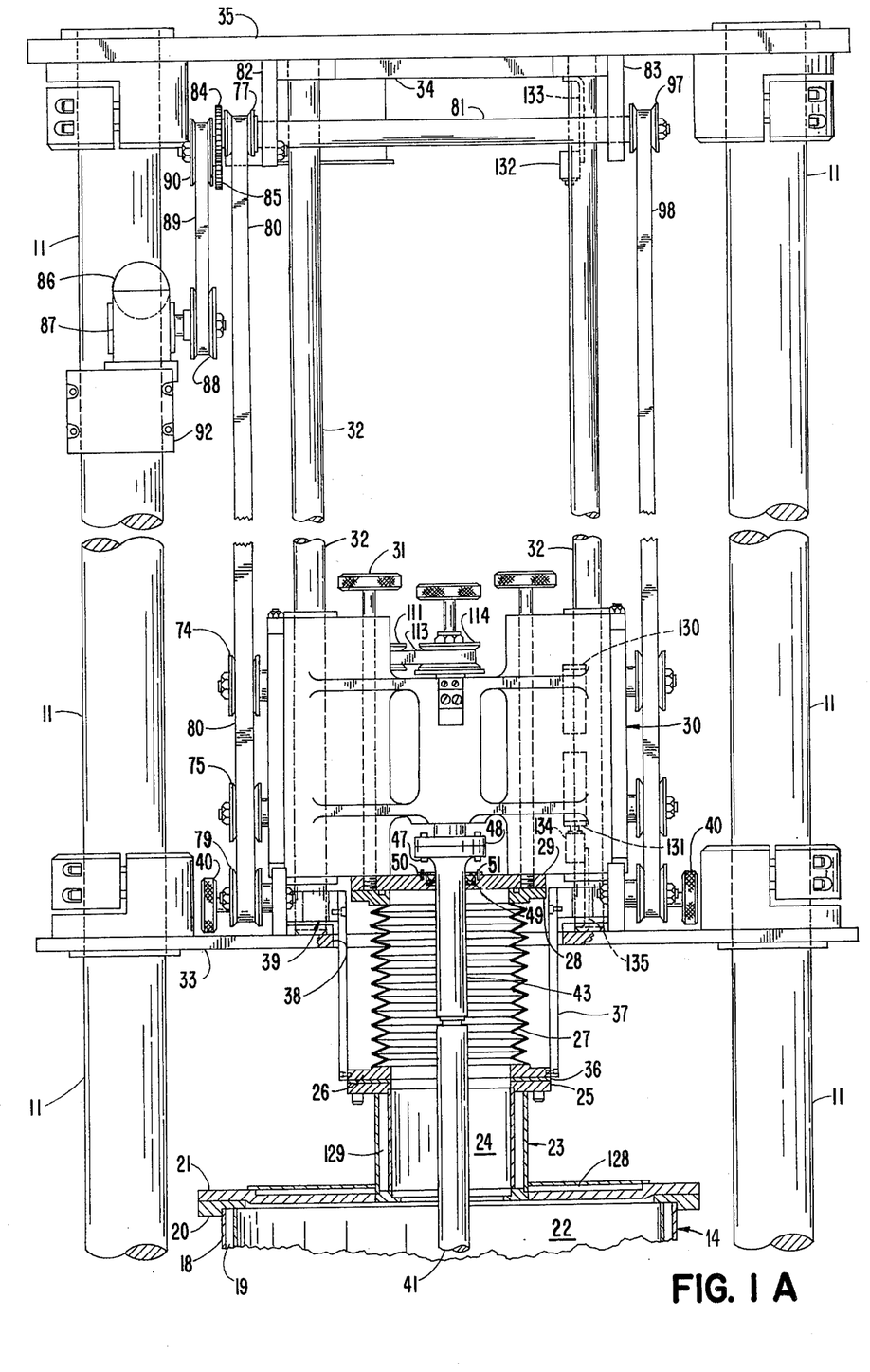
FIGS. 1A and 1B are elevational views, partly in section, of the system of the present invention for growing an ingot of monocrystalline silicon with the structure of FIG. 1A being disposed above the structure of FIG. 1B.
Figure 1B:
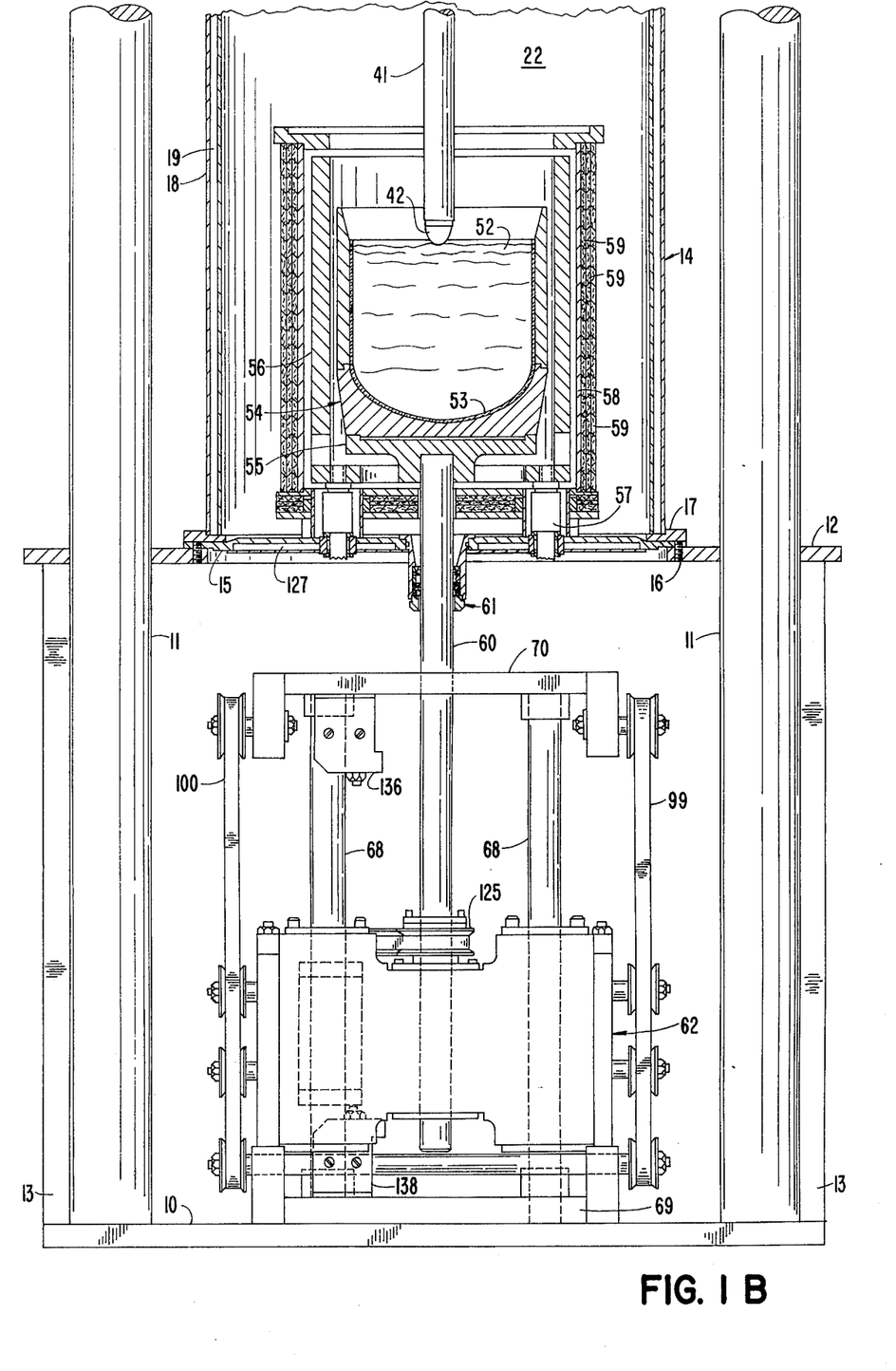

Referring to the drawings and particularly FIGS. 1A and 1B, there is shown a support structure including a base plate 10 (see FIG. 1B) from which three support posts 11 (two shown) extend upwardly and are disposed in a triangular relation to each other. The base plate 10 is supported on the floor.

An intermediate support plate 12 (see FIG. 1B) is disposed in spaced relation to the base plate 10 and has a furnace 14 supported thereby. The support plate 12 is rectangular shaped and is supported at each of its corners by a support post 13 extending upwardly from the base plate 10.

The furnace 14 includes a base plate 15, which is fixed by screws 16 to the support plate 12. A ring 17 is fixed to the base plate 15 by suitable means such as clamps (not shown), for example. An outer cylindrical wall 18, which is hollow so that cooling water can circulate through its annular chamber 19, extends upwardly from the ring 17 to which it is secured by suitable means such as welding, for example. The upper end of the wall 18 has a ring 20 (see FIG. 1A) secured thereto by suitable means such as welding, for example.

An annular plate 21 is supported on the upper surface of the upper ring 20 and secured thereto by suitable means such as clamps (not shown), for example. Thus, a furnace chamber 22 is defined within the wall 18 between the plates 15 and 21.

A hollow wall 23 extends upwardly from the plate 21 to form a reduced portion 24 of the furnace chamber 22. The upper end of the hollow wall 23 has an annular top plate 25 secured thereto by suitable means such as welding, for example.

The top plate 25 of the furnace 14 has a lower ring 26 of a bellows structure releasably connected thereto by suitable clamps (not shown). The ring 26 has the lower end of a bellows 27, which is formed of a suitable material such as expansible steel, for example, secured thereto by suitable means such as welding, for example. The upper end of the bellows 27 is attached to an upper ring 28 by suitable means such as welding, for example. The upper ring 28 is secured by suitable means such as screws (not shown), for example, to a bellows top plate 29. The bellows top plate 29 is secured to a vertically movable upper carriage 30 by screws 31 for movement therewith.

The upper carriage 30 is slidably mounted on a pair of guide rods 32, which extend upwardly from an intermediate support plate 33. The intermediate support plate 33 is fixed to the three support posts 11 by suitable means such as clamps and screws, for example.

The plate 33 is triangular shaped and has one of the support posts 11 at each of its apexes.

The upper end of each of the guide rods 32 extends into a plate 34. The plate 34 and each of the guide rods 32 are secured by suitable means such as screws, for example, to an upper support plate 35.

The upper support plate 35 is carried at the upper ends of the support posts 11 and is triangular shaped so that one of the support posts 11 is at each of the apexes of the plate 35. The upper support plate 35 is secured to the support posts 11 by suitable means such as clamps and screws, for example.

The lower ring 26 of the bellows 27 also is supported for movement along the guide rods 32. The ring 26 is fixed to a ring 36 by suitable means such as welding, for example. The ring 36 is secured by screws to the lower end of each of a pair of diametrically opposed hangers 37. The hangers 37 extend through an opening 38 in the support plate 33 as does the bellows 27.

The upper end of each of the hangers 37 is secured to a collar 39 by suitable means such as screws, for example. Each of the collars 39 is slidably mounted on one of the guide rods 32. The collars 39 may be retained in any position on the guide rods 32 by screws 40. Thus, whenever the ring 26 is released from the top plate 25 of the furnace 14, the bellows 27 is held in the raised position by the screws 40.

Figure 3:
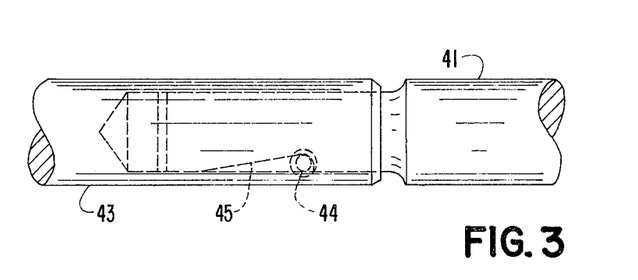
FIG. 3 is a fragmentary side elevational view showing the connection between the pull shaft and the pull shaft stud.

In addition to having the bellows 27 secured thereto, the upper carriage 30 also has a pull shaft 41, which carries a seed 42 (see FIG. 1B) of monocrystalline silicon at its lower end, connected thereto. The pull shaft 41, which is preferably formed of graphite, is releasably connected to a pull shaft stud 43 (see FIG. 1A), which is preferably formed of stainless steel. The pull shaft 41 is preferably connected to the pull shaft stud 43 by a locking pin 44 (see FIG. 3) extending through a notch 45 in the pull shaft 41. The locking pin 44 extends through a pair of openings in the pull shaft stud 43. The openings are not diametrically aligned but are disposed on one side of the center of the pull shaft stud 43. The pull shaft stud 43 is connected by screws 47 (see FIG. 1A) to a spindle 48, which is carried by the upper carriage 30. Accordingly, the pull shaft 41 is connected to the upper carriage 30 for vertical movement therewith.

The pull shaft stud 43 extends through a seal 49, which is carried in the bellows top plate 29, into the bellows 27. A seal retaining plate 50, which is secured to the bellows top plate 29 by screws 51, retains the seal 49 in the bellows top plate 29. The seal 49 cooperates with the pull shaft stud 43 to form a rotary seal. The seal 49 seals the upper end of the furnace chamber 22, which communicates with the interior of the bellows 27 through the reduced portion 24 of the chamber 22, from the atmosphere.

When the upper carriage 30 is in its lowermost position as shown in FIG. 1A, the seed 42 (see FIG. 1B) of the pull shaft 41 is disposed within molten silicon 52 in a crucible 53, which is formed of a material such as quartz, for example. The crucible 53 is supported within a holder 54, which is mounted on a turntable 55 so that the crucible 53 is rotated whenever the turntable 55 is rotated. The holder 54 and the turntable 55 are preferably formed of graphite.

A carbon heater 56 surrounds the crucible holder 54 to provide heat to the molten silicon 52 in the crucible 53 to maintain it at the desired temperature. Three electrodes 57 (two shown) are connected to the heater 56 to supply electricity thereto.

An annular shaped cylindrical liner 58, which is preferably formed of graphite, is disposed in spaced surrounding relation to the heater 56 and has three layers 59 of graphite felt on the exterior thereof. This heat insulation arrangement maintains the heat from the heater 56 within the liner 58 so that the heat is applied to the molten silicon 52 in the crucible 53.

The turntable 55 is supported on the upper end of a hollow support shaft 60, which extends downwardly from the turntable 55 through a rotary and linear seal 61 carried by the base plate 15 of the furnace 14. The support shaft 60 is connected to a vertically movable lower carriage 62.

Figure 5:
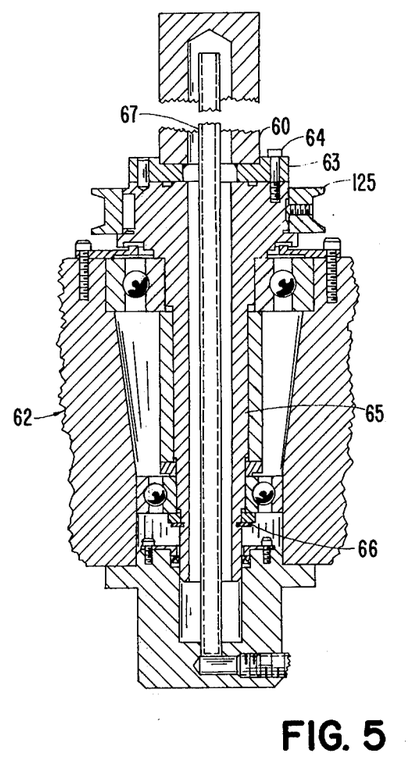
FIG. 5 is a fragmentary view, partly in section and partly in elevation, of a portion of the carriage for raising and lowering the crucible.

As shown in FIG. 5, the lower end of the shaft 60 has a ring 63 fixed thereto by suitable means such as welding, for example. The ring 63 is connected by screws 64 to a hollow shaft 65, which is rotatably mounted in the lower carriage 62. The shaft 65 is held in the lower carriage 62 against vertical movement relative to the lower carriage 62 by a retaining ring 66.

A hollow tube 67 extends upwardly through the shaft 65 and the shaft 60 and is of smaller diameter than the inner diameter of the shaft 60 or the shaft 65 to form a longitudinal annular space therebetween. Water is supplied through the tube 67 to its upper end, which terminates adjacent the upper end of the shaft 60, and then returned in the longitudinal annular space between the hollow tube 67 and the inner surfaces of the shaft 60 and the shaft 65 to cool the shafts 60 and 65.

The lower carriage 62 is slidably supported on a pair of guide rods 68 (see FIG. 1B), which extend upwardly from a plate 69. The plate 69 rests on the base plate 10 and is secured thereto by suitable means such as screws, for example. An upper support plate 70 is secured to the upper ends of the guide rods 68 by suitable means such as screws, for example.

Figure 2:
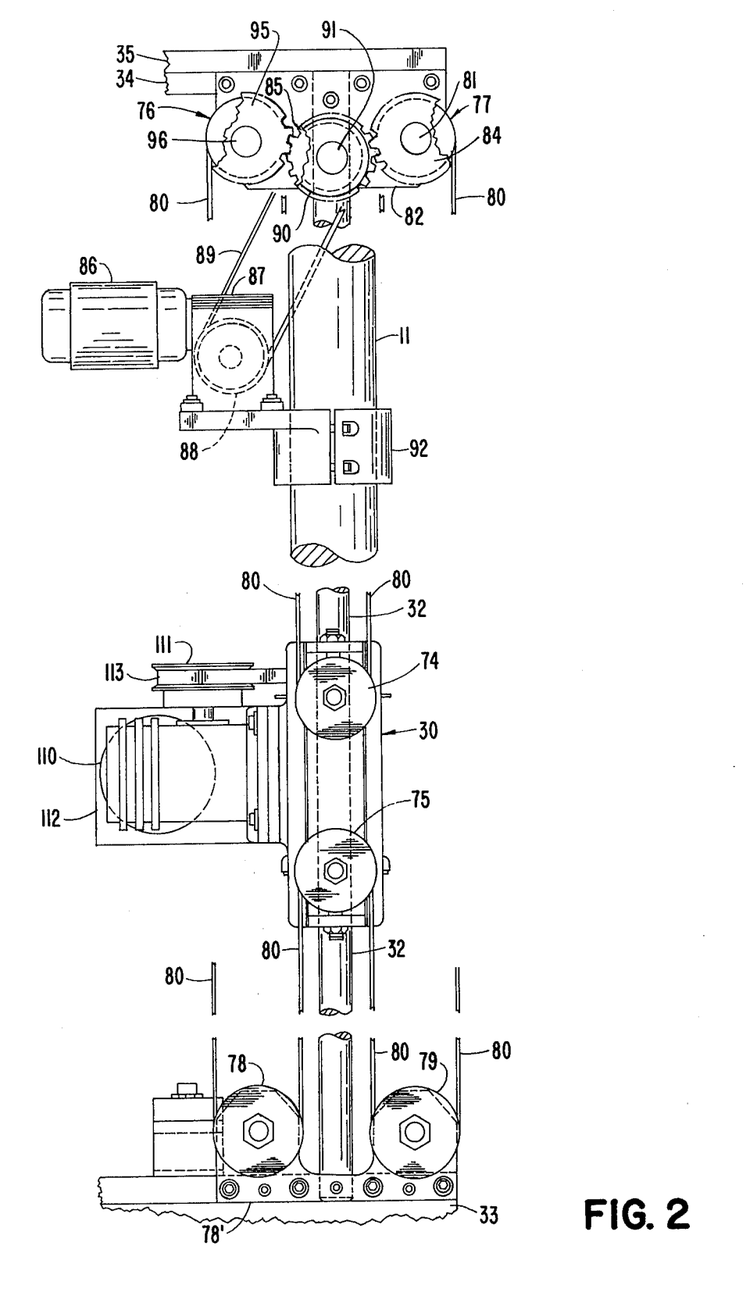
FIG. 2 is a side elevational view of a portion of the structure of FIGS. 1A and 1B and showing a lifting mechanism for one side of the pull shaft carriage.

As shown in FIG. 2, the upper carriage 30 has an upper idler pulley 74 and a lower idler pulley 75 vertically disposed in spaced relation to each other with their axes of rotation on the same vertical line or plane. The idler pulleys 74 and 75 form part of a lifting mechanism for the upper carriage 30. The lifting mechanism not only raises and lowers the upper carriage 30 but also supports the upper carriage 30.

The lifting mechanism also includes a driven timing pulley 76 and a driven timing pulley 77 disposed adjacent the upper support plate 35. The lifting mechanism also includes a pair of idler timing pulleys 78 and 79 rotatably supported in a bracket 78'. The bracket 78' is disposed on the support plate 33.

The driven pulley 76 and the idler pulley 78 have their axes of rotation on the same vertical line or plane. Similarly, the driven pulley 77 and the idler pulley 79 have their axes of rotation on the same vertical line or plane. The vertical line or plane passing through the axes of rotation of the idler pulleys 74 and 75 on the upper carriage 30 is disposed parallel to the vertical lines or planes connecting the axes of rotation of the pulleys 76 and 78 and the axes of rotation of the pulleys 77 and 79 and therebetween.

A single continuous timing belt 80 passes around the top of the driven timing pulley 76, the bottom of the idler pulley 74 on the upper carriage 30, the top of the driven timing pulley 77, the bottom of the lower idler timing pulley 79, the top of the lower idler pulley 75 on the upper carriage 30, and the bottom of the lower idler timing pulley 78 prior to returning to the driven timing pulley 76. The teeth of the timing belt 80 mesh with teeth on the timing pulleys 76, 77, 78, and 79. However, the smooth surface of the back of the timing belt 80 passes around the pulleys 74 and 75 so that they are not timing pulleys.

The driven timing pulley 77 is fixed to a shaft 81, which is rotatably supported in brackets 82 and 83 extending downwardly from the upper support plate 35. A gear 84 is fixed on one end of the shaft 81 and meshes with a gear 85.

The gear 85 is driven from an electric motor 86 through a gear box 87. A pulley 88 on the output shaft of the gear box 87 is connected by a timing belt 89 with a timing pulley 90 fixed on a shaft 91 on which the gear 85 is also fixed.

The motor 86 and the gear box 87 are supported from one of the support posts 11 by a bracket 92. The shaft 91 is rotatably supported in the bracket 82.

The gear 85 also meshes with a gear 95, which is fixed on one end of a shaft 96. The shaft 96, which is rotatably supported in the brackets 82 and 83 in the same manner as the shaft 81, has the driven timing pulley 76 fixed thereto adjacent the gear 95.

By forming one more tooth on the gear 95 than on the gear 84, there will be a slight difference in rotation of the driven timing pulleys 76 and 77 during each revolution of the gear 85. That is, if the gear 85 is rotating clockwise, then a slightly greater length of the belt 80 will be advanced from the driven timing pulley 77 to the idler pulley 74 than is advanced from the idler pulley 74 to the driven timing pulley 76 during a revolution of the gear 85. Similarly, a slightly greater length of the belt 80 will be advanced from the idler pulley 75 to the idler timing pulley 79 than from the idler timing pulley 78 to the idler pulley 75 during a revolution of the gear 85. As a result, the upper carriage 30 will be moved downwardly. Counterclockwise rotation of the gear 85 lifts the upper carriage 30 along the guide rods 32.

It should be understood that the upper carriage 30 has a similar lifting mechanism on its diametrically opposite side so that the resultant lifting or lowering force is transmitted along the longitudinal axis of the pull shaft 41. As shown in FIG. 1A, the shaft 81 has a driven timing pulley 97 at its opposite end from the driven timing pulley 77 for cooperation with a timing belt 98 of the lifting mechanism on the opposite side of the upper carriage 30 from the lifting mechanism having the timing belt 80. The shaft 96 also has a driven timing pulley (not shown) on its opposite end for cooperation with the timing belt 98 in the same manner as the shaft 81 has the driven timing pulley 97.

The lower carriage 62 has a similar lifting mechanism on opposite sides thereof. One of the lifting mechanisms for the lower carriage 62 has a timing belt 99, and the other lifting mechanism for the lower carriage 62 has a timing belt 100. It should be understood that a separate motor, which is supported by the base plate 10, drives the lifting mechanisms for the lower carriage 62 in the same manner that the motor 86 drives the lifting mechanisms for the upper carriage 30. This enables the rate of the lift of each of the carriages 30 and 62 to be controlled separately.

The separate rates of lift of the upper carriage 30 and the lower carriage 62 are necessary to control the crystal growth of the ingot. The upper carriage 30 is raised to govern the growth of the diameter of the ingot. The rate of lift of the upper carriage 30 and the connected pull shaft 41 is inversely proportional to the diameter of the crystal ingot. Therefore, if the diameter of the crystal ingot ceases to remain constant, the rate of lift of the upper carriage 30 must be changed.

As the mass of the molten silicon 52 decreases due to its formation as part of the ingot, the thermal conditions of the furnace 22 change. To compensate for this change in conditions while still maintaining a substantially constant diameter of the ingot, the rate of lift of the upper carriage 30 must be changed.

The lift rate for the lower carriage 62 controls the level of the molten silicon 52 in the crucible 53 and insures that the level of the molten silicon 52 is in the isothermal heating zone. An optical pyrometer measures the heat in the heater 56 to control the power input to compensate for changes in the thermal conditions.

Figure 4:
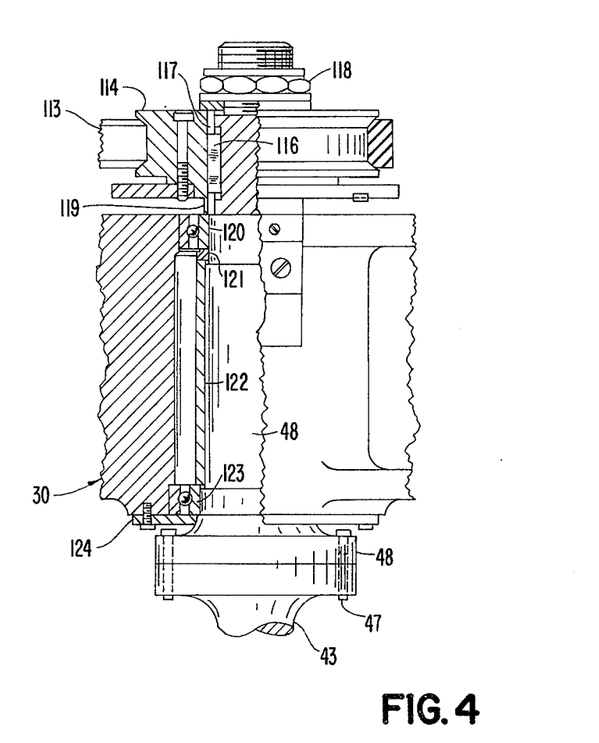
FIG. 4 is a fragmentary view, partly in section and partly in elevation, of a portion of the carriage for raising and lowering the pull shaft.

The upper carriage 30 has a motor 110 (see FIG. 2) supported thereby for movement with the upper carriage 30. The motor 110 drives a timing pulley 111 through a gear box 112. A timing belt 113 connects the pulley 111 with a timing pulley 114 (see FIGS. 1A and 4), which is connected to the pull shaft stud 43. Accordingly, rotation of the motor 110 causes rotation of the pull shaft 41 and the ingot being grown from the seed 42 on the end of the pull shaft 41 in the desired direction at the desired rate of speed. The rotation of the pull shaft 41 and the ingot being grown on the end thereof gives a better heat distribution on the ingot.

The pull shaft stud 43 is connected to the pulley 114 through the spindle 48 (see FIG. 4) extending through the upper carriage 30. The upper end of the spindle 48 carries a key 116, which is disposed within a key slot 117 in the pulley 114 so that rotation of the pulley 114 is transmitted to the spindle 48.

The spindle 48 has its upper end threaded to receive a lock nut 118, which causes a downwardly depending flange 119 on the lower end of the pulley 114 to engage against the inner race of an upper bearing 120. The upper bearing 120 is retained in position through a spacer 121 and a spacer sleeve 122 cooperating with the inner race of a lower bearing 123. A plate 124 is secured to the lower end of the upper carriage 30 to support the lower end of the lower bearing 123 and prevent any vertical movement of the lower bearing 123, the spacer sleeve 122, the spacer 121, the bearing 120, and the pulley 114. Thus, the pull shaft stud 43 is prevented from moving longitudinally relative to the upper carriage 30 while being rotatable relative thereto.

The lower carriage 62 has an electric motor for rotating a timing pulley 125, which is secured to the shaft 65. The drive to the pulley 125 from the motor is in the same manner as the drive to the pulley 114 from the motor 112 on the upper carriage 30. This enables the crucible 53 to be rotated at the desired rate of speed and in either the same direction or the opposite direction to that in which the pull shaft 41 is rotated depending on the particular conditions.

Considering the operation of the present invention, the bellows lower ring 26 (see FIG. 1A) is clamped to the top plate 25 of the furnace 14. With the ring 26 clamped to the top plate 25 of the furnace 14, there is an enclosed chamber (the furnace chamber 22) to which an inert gas is supplied and exhausted to provide the desired atmosphere for the carbon heater 56 (see FIG. 1B). Water is supplied to the furnace 14 for cooling not only in the chamber 19 but also in a space 127 at the bottom of the furnace 14 beneath the base plate 15, a space 128 (see FIG. 1A) at the top of the furnace 14 above the plate 21, and a chamber 129 in the wall 23, which defines the reduced portion 24 of the chamber 22.

The upper carriage 30 is lowered so that the seed 42 on the lower end of the pull shaft 41 is disposed within the molten silicon 52 (see FIG. 1B). The furnace chamber 14 is heated to the desired temperature by the heater 56 to maintain the silicon 52 molten.

The crucible 53 is rotated in the desired direction at the desired speed from the rotating motor carried on the lower carriage 62 through the support shaft 60 and the turntable 55. At the same time, the pull shaft 41 is rotated by the motor 110 (see FIG. 2) in the desired direction, which can be the same as or opposite to that in which the crucible 53 is being rotated.

The rate of lifting of the upper carriage 30 (see FIG. 1A) to lift the pull shaft 41 upwardly is determined by the growth rate of the silicon ingot on the end of the seed 42 (see FIG. 1B). Of course, as the ingot grows on the end of the seed 42, the level of the molten silicon 52 decreases. Accordingly, the lower carriage 62 is moved upwardly at a desired rate to maintain the top of the molten silicon 52 in the isothermal heat zone created by the heater 56.

As the pull shaft 41 is lifted upwardly, the bellows 27 (see FIG. 1A) expands to increase the length and volume of the furnace chamber 22 as the length of the ingot grows. Thus, the pull shaft 41 and the ingot on its end always remain within the furnace chamber 22 since the top plate 29 of the bellows is fixed to the upper carriage 30 for movement therewith so that there is no relative movement between the pull shaft 41 and the upper end of the bellows 27 since the top plate 29 of the bellows 27 defines the top of the furnace chamber 22.

It should be understood that the movements of each of the upper carriage 30 and the lower carriage 62 are limited in both the up and down directions. Thus, the upper carriage 30 has an upper bracket 130 and a lower bracket 131 adjustably mounted thereon.

When the upper carriage 30 reaches its maximum upper position, the upper bracket 130 engages a switch 132, which is carried on a bracket 133 supported from the support plate 34, to deenergize the motor 86 and stop upward movement of the upper carriage 30. Similarly, when the upper carriage 30 reaches its maximum lowermost position, the lower bracket 131 engages a switch 134, which is carried by a bracket 135 supported by the plate 33, to deenergize the motor 86.

The lower carriage 62 has a similar arrangement with an upper switch 136 being supported on the plate 70 connecting the tops of the guide rods 68 and a lower switch 138 supported on the plate 69. Brackets carried by the lower carriage 62 cooperate with the switches 136 and 138.

While the present invention has shown and described an ingot being formed of silicon, it should be understood that the present invention could be utilized with any material from which it is desired to grow a monocrystalline ingot. Of course, the seed 42 would be formed of a different material depending on what the ingot is to be formed of, and the crucible 53 would contain the same molten material as the material of the seed 42.

While the present invention has shown and described a gearing arrangement to create the differential relationship for the lifting mechanisms for the upper carriage 30 and the lower carriage 62, it should be understood that any other suitable driving arrangement could be employed. For example, each of the gears connected to the driven pulleys could be replaced by a differential timing pulley with a timing belt extending around the two pulleys, the two pulleys being of different diameters, and an input being supplied to only one of the two differential timing pulleys.

An advantage of this invention is that it reduces the overall height of the structure for producing an ingot while still having a relatively long movement of the pull shaft to grow a relatively long ingot. Another advantage of this invention is that there is no eccentric load applied to the pull shaft. A further advantage of this invention is that it is not necessary to increase the height of a room for an increase in the length of the ingot. Still another advantage of this invention is that quicker growth of a monocrystalline ingot is obtained while still controlling the desired parameters of the ingot. A still further advantage of this invention is that the top seal for the pull shaft is not subjected to potential damage because of any linear motion of the pull shaft.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A system for growing a single crystal ingot from a molten material including:
   a furnace chamber;
   support means within said furnace chamber for the molten material;
   pull shaft means extending into said furnace chamber to support a monocrystalline seed for disposition within the molten material to have the ingot grow thereon;
   said pull shaft means includes:
      a first shaft connected to said first lifting means and in sealing contact with said seal, said first shaft being formed of a material capable of having precise tolerances;
      a second shaft supporting the seed said second shaft having a higher thermal conductivity than said first shaft and being formed of a material capable of withstanding their temperatures in said furnace chamber without warping;
      and means to connect said first and second shafts to each other;
   said furnace chamber having heating means producing an optimum heating zone within said furnace chamber;
   first lifting means to linearly lift said pull shaft means as the ingot grows from the molten material, said first lifting means includes a pair of raising and lowering means disposed on diametrically opposite sides of the longitudinal axis of said pull shaft means and exerting a resultant lifting force only along the longitudinal axis of said pull shaft means;
   second lifting means to linearly lift said support means as the level of the molten material falls to maintain the level of the molten material within the optimum heating zone of said heating means in said furnace chamber, said second lifting means exerting a resultant lifting force only along the longitudinal axis of said pull shaft means;
first rotating means to rotate said pull shaft means;
second rotating means to rotate said support means;
a seal between a portion of said first shaft of said pull shaft means at the entry of said pull shaft means into said furnace chamber and said furnace chamber to seal said pull shaft means at its entry into said furnace chamber during rotation of said pull shaft means;
and means to prevent relative linear motion between said seal and said pull shaft means when said first lifting means lifts said pull shaft means.

2. The system according to claim 1 in which said first lifting means includes:
a carriage;
means to slidably mount said carriage for linear motion;
means to connect said pull shaft means to said carriage;
and said pair of raising and lowering means being disposed on diametrically opposite sides of said carriage and acting on said carriage to exert the resultant lifting force only along the longitudinal axis of said pull shaft means.

3. The system according to claim 2 in which each of said raising and lowering means includes:
a pair of driven pulleys disposed beyond one direction of travel of said carriage during its raising and lowering, said driven pulleys being spaced from each other in a horizontal direction;
driving means to drive both of said driven pulleys;
said driving means including means to drive one of said driven pulleys at a slightly greater speed than the other of said driven pulleys;
a first pair of idler pulleys disposed beyond the direction of travel of said carriage in the opposite direction from said driven pulleys, each of said first pair of idler pulleys being vertically aligned with a corresponding one of said driven pulleys;
a second pair of idler pulleys mounted on said carriage in vertically spaced relation to each other and in vertical alignment, said second pair of idler pulleys being disposed between the vertical alignments of said first pair of idler pulleys and said driven pulleys;
and a single continuous belt passing around one of said driven pulleys, one of said idler pulleys on said carriage, the other of said driven pulleys, one of said first pair of said idler pulleys, the other of said idler pulleys on said carriage, and the other of said first pair of said idler pulleys to support said carriage and cause raising and lowering thereof in accordance with the direction in which said driven pulleys are driven.

4. The system according to claim 3 in which said second lifting means includes:
a carriage;
means to slidably mount said carriage for linear motion;
means to connect said support means to said carriage;
and means acting on said carriage to exert the resultant lifting force only along the longitudinal axis of said pull shaft means.

5. The system according to claim 4 in which said acting means of said second lifting means includes a pair of raising and lowering means disposed on diametrically opposite sides of said carriage.

6. The system according to claim 5 in which each of said raising and lowering means of said acting means of said second lifting means includes:
a pair of driven pulleys disposed beyond one direction of travel of said carriage during its raising and lowering, said driven pulleys being spaced from each other in a horizontal direction;
driving means to drive both of said driven pulleys;
said driving means including means to drive one of said driven pulleys at a slightly greater speed than the other of said driven pulleys;
a first pair of idler pulleys disposed beyond the direction of travel of said carriage in the opposite direction from said driven pulleys, each of said first pair of idler pulleys being vertically aligned with one of said driven pulleys;
a second pair of idler pulleys mounted on said carriage in vertically spaced relation to each other and in vertical alignment, said second pair of idler pulleys being disposed between the vertical alignments of said first pair of idler pulleys and said driven pulleys;
and a single continuous belt passing around one of said driven pulleys, one of said idler pulleys on said carriage, the other of said driven pulleys, one of said first pair of said idler pulleys, the other of said idler pulleys on said carriage, and the other of said first pair of said idler pulleys to support said carriage and cause raising and lowering thereof in accordance with the direction in which said driven pulleys are driven.

7. The system according to claim 6 in which:
said preventing means includes:
expansible means surrounding said pull shaft means, said expansible means being connected to said furnace chamber and to said carriage of said first lifting means;
and said expansible means supporting said seal for movement with said pull shaft means when said carriage of said first lifting means moves said pull shaft means.

8. The system according to claim 7 in which said expansible means includes:
a bellows surrounding said pull shaft means;
first means to releasably connect one end of said bellows to said furnace chamber;
and second means to connect the other end end of said bellows to said carriage, said second connecting means supporting said seal.

9. The system according to claim 1 in which said second lifting means includes:
a carriage;
means to slidably mount said carriage for linear motion;
means to connect said support means to said carriage;
and means acting on said carriage to exert the resultant lifting force only along the longitudinal axis of said pull shaft means.

10. The system according to claim 9 in which said acting means includes a pair of raising and lowering means disposed on diametrically opposite sides of said carriage.

11. The system according to claim 10 in which each of said raising and lowering means includes:

a pair of driven pulleys disposed beyond one direction of travel of said carriage during its raising and lowering, said driven pulleys being spaced from each other in a horizontal direction;

driving means to drive both of said driven pulleys;

said driving means including means to drive one of said driven pulleys at a slightly greater speed than the other of said driven pulleys;

a first pair of idler pulleys disposed beyond the direction of travel of said carriage in the opposite direction from said driven pulleys, each of said first pair of idler pulleys being vertically aligned with one of said driven pulleys;

a second pair of idler pulleys mounted on said carriage in vertically spaced relation to each other and in vertical alignment, said second pair of idler pulleys being disposed between the vertical alignments of said first pair of idler pulleys and said driven pulleys;

and a single continuous belt passing around one of said driven pulleys, one of said idler pulleys on said carriage, the other of said driven pulleys, one of said first pair of said idler pulleys, the other of said idler pulleys on said carriage, and the other of said first pair of said idler pulleys to support said carriage and cause raising and lowering thereof in accordance with the direction in which said driven pulleys are driven.

12. The system according to claim 11 in which:
said preventing means includes:
expansible means surrounding said pull shaft means, said expansible means being connected to said furnace chamber and to said first lifting means;
and said expansible means supporting said seal for movement with said pull shaft means when said first lifting means moves said pull shaft means.

13. The system according to claim 12 in which said expansible means includes:
a bellows surrounding said pull shaft means;
first means to releasably connect one end of said bellows to said furnace chamber;
and second means to connect the other end of said bellows to said first lifting means, said second connecting means supporting said seal.

14. The system according to claim 1 in which:
said preventing means includes:
expansible means surrounding said pull shaft means, said expansible means being connected to said furnace chamber and to said first lifting means;
and said expansible means supporting said seal for movement with said pull shaft means when said first lifting means moves said pull shaft means.

15. The system according to claim 14 in which said expansible means includes:
a bellows surrounding said pull shaft means;
first means to releasably connect one end of said bellows to said furnace chamber;
and second means to connect the other end of said bellows to said first lifting means, said second connecting means supporting said seal.

16. The system according to claim 1 in which said second shaft is graphite.

17. The system according to claim 16 in which said first shaft is stainless steel.

18. The system according to claim 1 in which:
said first lifting means lifts at any selected rate;
said second lifting means lifts at any selected rate;
said first rotating means rotates said pull shaft means in either direction at any selected rate;
and said second rotating means rotates said support means in either direction at any selected rate.

* * * * *